United States Patent
Wu et al.

(10) Patent No.: US 12,490,616 B2
(45) Date of Patent: Dec. 2, 2025

(54) PIXEL ARRANGEMENT STRUCTURE AND DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Yuan Wu, Wuhan (CN); Tingting Wu, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 18/012,177

(22) PCT Filed: Aug. 30, 2022

(86) PCT No.: PCT/CN2022/115937
§ 371 (c)(1),
(2) Date: Dec. 21, 2022

(87) PCT Pub. No.: WO2024/036668
PCT Pub. Date: Feb. 22, 2024

(65) Prior Publication Data
US 2024/0244911 A1 Jul. 18, 2024

(30) Foreign Application Priority Data
Aug. 16, 2022 (CN) .......................... 202210980916.2

(51) Int. Cl.
*H10K 59/35* (2023.01)
(52) U.S. Cl.
CPC ......... *H10K 59/353* (2023.02); *H10K 59/352* (2023.02)
(58) Field of Classification Search
CPC ....... H10K 59/351–353; H10K 59/121; H10K 59/35; G02F 1/134309; G02F 2201/52
See application file for complete search history.

(56) References Cited

U.S. PATENT DOCUMENTS

2020/0075691 A1* 3/2020 Zhou ....................... H10K 59/35
2021/0013274 A1* 1/2021 He ......................... H10K 59/353
(Continued)

FOREIGN PATENT DOCUMENTS

CN  104037199    * 9/2014  ............ H01L 27/32
CN  104050889 A    9/2014
(Continued)

OTHER PUBLICATIONS

English translation of CN104037199 (Year: 2014).*
(Continued)

*Primary Examiner* — Eric K Ashbahian
(74) *Attorney, Agent, or Firm* — PV IP PC; Wei Te Chung

(57) ABSTRACT

A pixel arrangement structure and a display panel are disclosed. The pixel arrangement structure and the display panel can increase an overlapping area between sub-pixels in opposite directions. In this way, a light-emitting color of a pixel unit has a better saturation, thereby improving a light-emitting effect of the pixel unit.

18 Claims, 5 Drawing Sheets

(56) References Cited

U.S. PATENT DOCUMENTS

| | | | | |
|---|---|---|---|---|
| 2021/0175299 A1* | 6/2021 | Lee | ............... | H10K 59/353 |
| 2023/0247883 A1* | 8/2023 | Guan | ............... | H10K 59/353 257/40 |

FOREIGN PATENT DOCUMENTS

| | | | |
|---|---|---|---|
| CN | 111384083 | A | 7/2020 |
| CN | 112563311 | A | 3/2021 |
| CN | 114361232 | A | 4/2022 |
| CN | 114420739 | A | 4/2022 |
| CN | 114664905 | A | 6/2022 |
| CN | 114823811 | A | 7/2022 |
| JP | 2002229046 | A | 8/2002 |
| JP | 2006201485 | A | 8/2006 |
| WO | 2016093479 | A1 | 6/2016 |
| WO | 2022042749 | A1 | 3/2022 |

OTHER PUBLICATIONS

Chinese Office Action issued in corresponding Chinese Patent Application No. 202210980916.2 dated Nov. 26, 2024, pp. 1-7.
International Search Report in International application No. PCT/CN2022/115937, mailed on May 9, 2023.
Written Opinion of the International Search Authority in International application No. PCT/CN2022/115937, mailed on May 9, 2023.

\* cited by examiner

PIXEL ARRANGEMENT STRUCTURE AND DISPLAY PANEL

CROSS REFERENCE TO RELATED APPLICATIONS

This application is a National Stage of International Application No. PCT/CN2022/115937, filed Aug. 30, 2022, which in turn claims the benefit of Chinese Patent Application 202210980916.2, filed Aug. 16, 2022. The entire disclosures of the above applications are incorporated herein by reference.

FIELD OF THE DISCLOSURE

The present application relates to the field of display technologies, and more particularly, to a pixel arrangement structure and a display panel

BACKGROUND

With the continuous innovation and improvement of AMOLED display technologies, design solutions of AMOLED display panels also tend to be diversified. A pixel arrangement of wearable and medium-sized AMOLED display panels still adopts a classic pixel arrangement of real RGB. However, an overlapping area between sub-pixels of a pixel structure of the classic pixel arrangement of real RGB in the opposite direction is low, therefore, a light-emitting effect may be affected.

SUMMARY

Technical Problem

The present application provides a pixel arrangement structure and a display panel to improve the technical problem of a light-emitting effect of pixels.

Technical Solution

The application provides a pixel arrangement structure, which includes:
a plurality of pixel repeating units arranged in an array; wherein one of the plurality of pixel repeating units comprises:
a first sub-pixel;
a second sub-pixel;
a third sub-pixel;
a first virtual straight line disposed along a first direction, the first virtual straight line passing through the first sub-pixel and the second sub-pixel;
a second virtual straight line disposed along the first direction, the second virtual straight line passing through the second sub-pixel and the third sub-pixel;
a third virtual straight line disposed along a second direction, the third virtual straight line passing through the first sub-pixel and the third sub-pixel; and
a fourth virtual straight line disposed along the second direction, the fourth virtual straight line passing through the second sub-pixel and the third sub-pixel;
wherein the first direction is perpendicular to the second direction.

Optionally, in some embodiments of the present application, the one of the plurality of pixel repeating units further comprises:

a fifth virtual straight line disposed along the first direction, the fifth virtual straight line passing through the second sub-pixel but not passing through the first sub-pixel.

Optionally, in some embodiments of the present application, the one of the plurality of pixel repeating units further comprises:
a sixth virtual straight line disposed along the second direction, the sixth virtual straight line passing through the third sub-pixel but not passing through the first sub-pixel.

Optionally, in some embodiments of the present application, an area of the first sub-pixel is greater than an area of the second sub-pixel, and the area of the second sub-pixel is greater than an area of the third sub-pixel.

Optionally, in some embodiments of the present application, in a row direction, a center connecting line of the first sub-pixel and a center connecting line of the second sub-pixel are not coaxial.

Optionally, in some embodiments of the present application, in a row direction, a center connecting line of the first sub-pixel and a center connecting line of the third sub-pixel are not coaxial.

Optionally, in some embodiments of the present application, in a column direction, a center connecting line of the first sub-pixel and a center connecting line of the third sub-pixel are not coaxial.

Optionally, in some embodiments of the present application, in a column direction, a center connecting line of the second sub-pixel and a center connecting line of the third sub-pixel are not coaxial.

Optionally, in some embodiments of the present application, an outer contour of the one of the plurality of pixel repeating units is a polygon, outer contours of two adjacent pixel repeating units have two adjacent edges, and the two adjacent edges of the outer contours of the two adjacent pixel repeating units are parallel.

Optionally, in some embodiments of the present application, a shape of the first sub-pixel comprises a shape composed of an outer convex arc and/or an inner concave arc, a shape of the second sub-pixel is a shape comprising an outer convex arc and/or an inner concave arc, a shape of the third sub-pixel is a shape comprising an outer convex arc and/or an inner concave arc, a first side of the first sub-pixel and a first side of the third sub-pixel extend in a same direction, a first side of the second sub-pixel and a second side of the third sub-pixel extend in a same direction, a second side of the first sub-pixel and a second side of the second sub-pixel extend in a same direction, the second side of the first sub-pixel and the second side of the second sub-pixel are complementary in shape, the first side of the first sub-pixel and the first side of the third sub-pixel are complementary in shape, and the first side of the second sub-pixel and the second side of the third sub-pixel are complementary in shape.

Optionally, in some embodiments of the present application, the second side of the first sub-pixel is one of the outer convex arc and the inner concave arc, and the second side of the second sub-pixel is the other of the outer convex arc and the inner concave arc.

Optionally, in some embodiments of the present application, the first side of the first sub-pixel is one of the outer convex arc and the inner concave arc, and the first side of the third sub-pixel is the other of the outer convex arc and the inner concave arc.

Optionally, in some embodiments of the present application, the first side of the second sub-pixel is one of the outer convex arc and the inner concave arc, and the second side of the third sub-pixel is the other of the outer convex arc and the inner concave arc.

Optionally, in some embodiments of the present application, an outer contour of the one of the plurality of pixel repeating units is a quadrilateral, and shapes of the first sub-pixel, the second sub-pixel, and the third sub-pixel are quadrilateral.

Optionally, in some embodiments of the present application, the shapes of the second sub-pixel and the third sub-pixel are trapezoids, an oblique waist of the trapezoid of the second sub-pixel is arranged in parallel with an oblique waist of the trapezoid of the third sub-pixel.

Optionally, in some embodiments of the present application, in a same one of the plurality of pixel repeating units, the shape of the first sub-pixel is a square, the shapes of the second sub-pixel and the third sub-pixel are right-angled trapezoids; a first side of the square of the first sub-pixel is arranged in parallel with a first base of the right-angled trapezoid of the second sub-pixel, a second side of the square of the first sub-pixel is arranged in parallel with a first bottom side of the right-angled trapezoid of the third sub-pixel, and the first side of the square of the first sub-pixel is adjacent to the second side of the square of the first sub-pixel.

Optionally, in some embodiments of the present application, an outer contour of the one of the plurality of pixel repeating units is a hexagon, shapes of the first sub-pixel and the second sub-pixel are quadrilateral, and a shape of the third sub-pixel is a pentagon.

Optionally, in some embodiments of the present application, in a same one of the plurality of pixel repeating units, a first side of the pentagon of the third sub-pixel is arranged in parallel with a first side of the quadrilateral of the first sub-pixel, a second side of the pentagon of the third sub-pixel is arranged in parallel with a first side of the quadrilateral of the second sub-pixel, a second side of the quadrilateral of the first sub-pixel is arranged in parallel with a second side of the quadrilateral of the second sub-pixel, the first side of the pentagon of the third sub-pixel is adjacent to the second side of the pentagon of the third sub-pixel, the first side of the quadrilateral of the first sub-pixel is adjacent to the second side of the quadrilateral of the first sub-pixel, and the first side of the quadrilateral of the second sub-pixel is adjacent to the second side of the quadrilateral of the second sub-pixel.

Optionally, in some embodiments of the present application, a third side of the pentagon of the third sub-pixel is located on a first side of the hexagon of the one of the plurality of pixel repeating units, a fourth side of the pentagon of the third sub-pixel is located on a second side of the hexagon of the one of the plurality of pixel repeating units, a fifth side of the pentagon of the third sub-pixel and a fourth side of the quadrilateral of the first sub-pixel are located on a third side of the hexagon of the one of the plurality of pixel repeating units, a third side of the quadrilateral of the first sub-pixel is located on a fourth side of the hexagon of the one of the plurality of pixel repeating units, a third side of the quadrilateral of the second sub-pixel is located on a fifth side of the hexagon of the one of the plurality of pixel repeating units, and a fourth side of the quadrilateral of the second sub-pixel is located on a sixth side of the hexagon of the one of the plurality of pixel repeating units.

Correspondingly, the present application further provides a display panel comprising a pixel arrangement structure; the pixel arrangement structure comprises:

a plurality of pixel repeating units arranged in an array; wherein one of the plurality of pixel repeating units comprises:
a first sub-pixel;
a second sub-pixel;
a third sub-pixel;
a first virtual straight line disposed along a first direction, the first virtual straight line passing through the first sub-pixel and the second sub-pixel;
a second virtual straight line disposed along the first direction, the second virtual straight line passing through the second sub-pixel and the third sub-pixel;
a third virtual straight line disposed along a second direction, the third virtual straight line passing through the first sub-pixel and the third sub-pixel; and
a fourth virtual straight line disposed along the second direction, the fourth virtual straight line passing through the second sub-pixel and the third sub-pixel;
wherein the first direction is perpendicular to the second direction.

Beneficial Effect

The present application provides a pixel arrangement structure and a display panel, wherein the pixel arrangement structure includes: a plurality of pixel repeating units arranged in an array; wherein one of the plurality of pixel repeating units comprises: a first sub-pixel; a second sub-pixel; a third sub-pixel; a first virtual straight line disposed along a first direction, the first virtual straight line passing through the first sub-pixel and the second sub-pixel; a second virtual straight line disposed along the first direction, the second virtual straight line passing through the second sub-pixel and the third sub-pixel; a third virtual straight line disposed along a second direction, the third virtual straight line passing through the first sub-pixel and the third sub-pixel; and a fourth virtual straight line disposed along the second direction, the fourth virtual straight line passing through the second sub-pixel and the third sub-pixel; wherein the first direction is perpendicular to the second direction. In the present application, the second sub-pixel, the first sub-pixel, and the third sub-pixel respectively have overlapping portions in the first direction, the third sub-pixel, the first sub-pixel, and the second sub-pixel respectively have overlapping portions in the second direction, such that an overlapping area between sub-pixels in opposite directions can be increased, and a light-emitting color of a pixel unit has a better saturation, thereby improving a light-emitting effect of the pixel unit.

BRIEF DESCRIPTION OF THE DRAWINGS

In order to illustrate the technical solutions in the embodiments of the present application more clearly, the following briefly introduces the accompanying drawings that are used in the description of the embodiments. Obviously, the drawings in the following description are only some embodiments of the present application. For those skilled in the art, other drawings can also be obtained from these drawings without creative effort.

DETAILED DESCRIPTION

Figure 1:
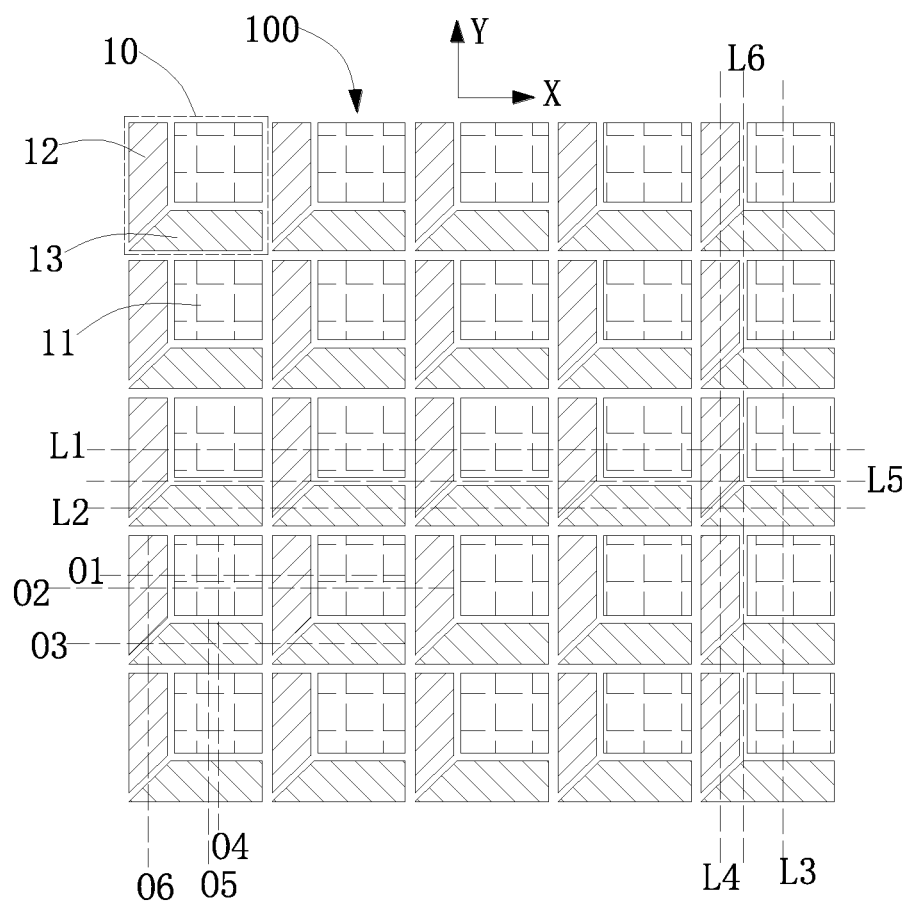
FIG. 1 is a first structural schematic diagram of a pixel arrangement structure provided by the present application.

The technical solutions in the embodiments of the present application will be clearly and completely described below with reference to the accompanying drawings in the embodiments of the present application. Obviously, the described embodiments are only a part of the embodiments of the present application, but not all of the embodiments. Based on the embodiments in this application, all other embodiments obtained by those skilled in the art without creative efforts shall fall within the protection scope of this application.

In the description of this application, it should be understood that the orientation or positional relationship indicated by the term "center", "length", "width", "upper", "lower", "front", "rear", "left", "right", "inner", "outer", etc. is based on the orientation or positional relationship shown in the drawings. It is for ease of describing the present application and to simplify the description only and is not intended to indicate or imply that the device or element referred to must have a particular orientation, be constructed, and operate in a particular orientation. Therefore, it should not be construed as a limitation on this application. In addition, the terms "first" and "second" are only used for descriptive purposes and should not be construed as indicating or implying relative importance or implying the number of indicated technical features. Thus, features defined as "first", "second" may expressly or implicitly include one or more of the features. In the description of the present application, "plurality" means two or more, unless otherwise expressly and specifically defined.

The present application provides a pixel arrangement structure and a display panel, which will be described in detail below. It should be noted that the description order of the following embodiments is not intended to limit the preferred order of the embodiments of the present application.

Figure 2:
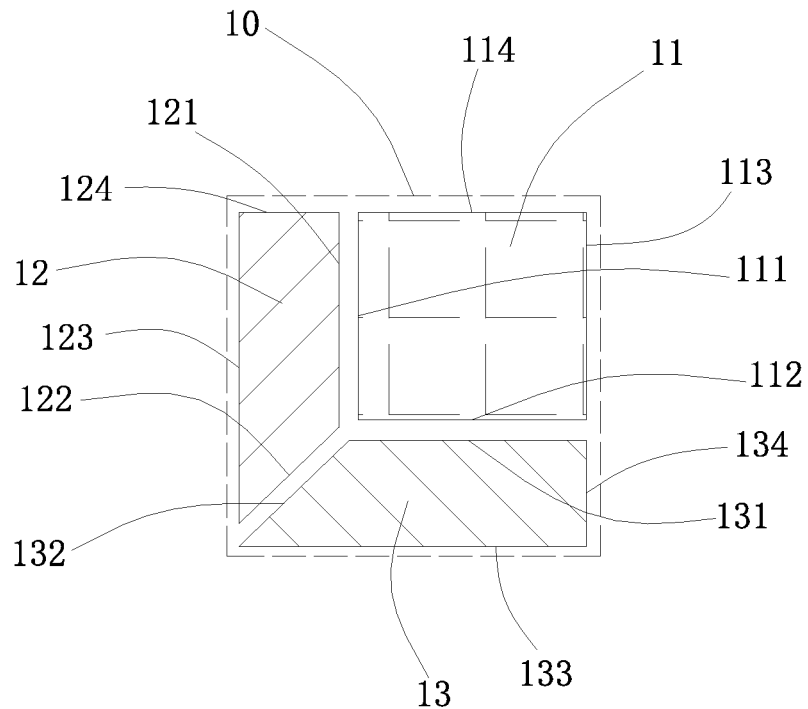
FIG. 2 is a schematic diagram of a pixel repeating unit in FIG. 1.

Refer to FIG. 1 and FIG. 2, FIG. 1 is a first structural schematic diagram of a pixel arrangement structure 100 provided by the present application, and FIG. 2 is a schematic diagram of a pixel repeating unit 10 in FIG. 1. The present application provides the pixel arrangement structure 100 including a plurality of pixel repeating units 10. The plurality of the pixel repeating units 10 are arranged in an array, a shape of the pixel repeating unit 10 is an N-sided shape, and N is greater than or equal to 4.

The pixel repeating unit 10 comprises:
a first sub-pixel 11;
a second sub-pixel 12;
a third sub-pixel 13;
a first virtual straight line L1 disposed along a first direction X, the first virtual straight line L1 passing through the first sub-pixel 11 and the second sub-pixel 12;
a second virtual straight line L2 disposed along the first direction X, the second virtual straight line L2 passing through the second sub-pixel 12 and the third sub-pixel 13;
a third virtual straight line L3 disposed along a second direction Y, the third virtual straight line L3 passing through the first sub-pixel 11 and the third sub-pixel 13; and
a fourth virtual straight line L4 disposed along the second direction Y, the fourth virtual straight line L4 passing through the second sub-pixel 12 and the third sub-pixel 13;
wherein the first direction is perpendicular to the second direction.

In the present application, the second sub-pixel, the first sub-pixel, and the third sub-pixel respectively have overlapping portions in the first direction, the third sub-pixel, the first sub-pixel, and the second sub-pixel respectively have overlapping portions in the second direction, such that an overlapping area between sub-pixels in opposite directions can be increased, and a light-emitting color of a pixel unit has a better saturation, thereby improving a light-emitting effect of the pixel unit.

That is, the second sub-pixel 12 has overlapping portions with the first sub-pixel 11 and the third sub-pixel 13 in the first direction X, respectively. The third sub-pixel 13 has overlapping portions with the first sub-pixel 11 and the second sub-pixel 12 in the second direction Y, respectively. In some embodiments, the first direction X is perpendicular to the second direction Y. The first direction X is a row direction or a column direction. The second direction Y is a column direction or a row direction. Specifically, in this embodiment, the first direction X is a row direction, and the second direction Y is a column direction.

The prior art pixel arrangement structure includes pixel units. The pixel unit includes a first sub-pixel 11, a second sub-pixel 12, and a third sub-pixel 13. However, the first sub-pixel 11, the second sub-pixel 12, and the third sub-pixel 13 do not necessarily have overlapping portions in the first direction X or in the second direction Y between every two sub-pixels. Therefore, the overlapping area between the sub-pixels is low, which affects a light-emitting effect of the pixel unit.

In the present application, the second sub-pixel 12 has overlapping portions with the first sub-pixel 11 and the third sub-pixel 13 in the first direction X, respectively, and the third sub-pixel 13 has overlapping portions with the first sub-pixel 11 and the second sub-pixel 12 in the second direction Y, respectively. Therefore, the overlapping area between the sub-pixels can be increased, so that the light-emitting color of the pixel unit has a better saturation. Therefore, the light-emitting effect of the pixel unit can be improved, and an aperture ratio of the sub-pixel can also be improved.

In some embodiments, adjacent edges of adjacent pixel repeating units 10 are arranged in parallel. In this way, the gap between the adjacent pixel repeating units 10 can be reduced, which is beneficial to improve the aperture ratio of the sub-pixels.

Specifically, the first side 111 of the first sub-pixel 11 may be any one of a straight line, an outer convex arc 15, and an inner concave arc 16. The second side 112 of the first sub-pixel 11 may be any one of a straight line, an outer convex arc 15, and an inner concave arc 16. The first side 121 of the second sub-pixel 12 may be any one of a straight line, an outer convex arc 15, and an inner concave arc 16.

The second side 132 of the third sub-pixel 13 may be any one of a straight line, an outer convex arc 15, and an inner concave arc 16.

The colors of the first sub-pixel 11, the second sub-pixel 12, and the third sub-pixel 13 may be different colors or the same color. In an embodiment of the present application, two of the first sub-pixel 11, the second sub-pixel 12, and the third sub-pixel 13 use the same color. Specifically, each pixel repeating unit 10 includes sub-pixels of two colors, and two adjacent pixel repeating units 10 include sub-pixels of three colors. In this embodiment, each pixel repeating unit 10 includes sub-pixels of three different colors. The first sub-pixel 11, the second sub-pixel 12, and the third sub-pixel 13 are respectively one of a red sub-pixel, a blue sub-pixel, and a green sub-pixel. Specifically, in this embodiment, the first sub-pixel 11 is a blue sub-pixel, the second sub-pixel 12 is a red sub-pixel, and the third sub-pixel 13 is a green sub-pixel. Further, the area of the first sub-pixel 11 is greater than that of the second sub-pixel 12, and the area of the second sub-pixel 12 is greater than that of the third sub-pixel 13.

In some embodiments, the pixel repeating unit 10 further includes: a fifth virtual straight line L5 disposed along the first direction X, the fifth virtual straight line L5 passing through the second sub-pixel 12 but not passing through the first sub-pixel 12 sub-pixel 11.

That is, the present application sets an orthographic projection of the first sub-pixel 11 in the first direction X within the range of an orthographic projection of the second sub-pixel 12 in the first direction X. Thus, a center-to-center distance between the first sub-pixel 11 and the third sub-pixel 13 can be reduced. This can make the proportion of the overlapping portion of the first sub-pixel 11 and the second sub-pixel 12 to be the largest, so that the light-emitting saturation and the light-emitting effect of the pixel unit can be improved.

Further, in some embodiments, the pixel repeating unit 10 further includes: a sixth virtual straight line L6 disposed along the second direction Y, the sixth virtual straight line L6 passing through the third sub-pixel 13 but not passing through the first sub-pixel 11.

That is, the present application sets the orthographic projection of the first sub-pixel 11 in the second direction Y within the range of the orthographic projection of the third sub-pixel 13 in the second direction Y Thereby, the center-to-center distance between the first sub-pixel 11 and the second sub-pixel 12 can be reduced. This can further maximize the proportion of the overlapping portion of the first sub-pixel 11 and the third sub-pixel 13. Therefore, the light-emitting saturation and the light-emitting effect of the pixel unit can be further improved.

To sum up, in the present application, the first sub-pixel 11 is disposed in the area defined by the first side 121 of the second sub-pixel 12 and the first side 131 of the third sub-pixel 13. Thereby, the center-to-center distance between the first sub-pixel 11 and the second sub-pixel 12 and the center-to-center distance between the first sub-pixel 11 and the third sub-pixel 13 can be reduced. Therefore, the proportion of the overlapping portion of the first sub-pixel 11 and the second sub-pixel 12 is maximized. This makes the proportion of the overlapping portion of the first sub-pixel 11 and the third sub-pixel 13 to be the largest. The light-emitting saturation and the light-emitting effect of the pixel unit can be further improved, and the aperture ratio of the sub-pixels can also be further improved.

Further, in the row direction, the central connecting line O1 of the first sub-pixel 11 and the central connecting line O2 of the second sub-pixel 12 are not coaxial. That is, the line connecting the centers of the first sub-pixels 11 on the same row and the line connecting the centers of the second sub-pixels 12 on the same row are not coaxial.

In the row direction, the central connecting line O1 of the first sub-pixel 11 and the central connecting line O3 of the third sub-pixel 13 are not coaxial. That is, the line connecting the centers of the first sub-pixels 11 on the same row and the line connecting the centers of the third sub-pixels 13 on the same row are not coaxial.

In the column direction, the center line O4 of the first sub-pixel 11 and the center line O5 of the third sub-pixel 14 are not coaxial. That is, the line connecting the centers of the first sub-pixels 11 located on the same column and the lines connecting the centers of the third sub-pixels 13 located on the same column are not coaxial.

In the column direction, the center line O6 of the second sub-pixel 12 is not coaxial with the center line O5 of the third sub-pixel 13. That is, the line connecting the centers of the second sub-pixels 12 on the same column is not coaxial with the line connecting the centers of the third sub-pixels 13 on the same column.

In some embodiments, the outer contour of the pixel repeating unit 10 is a polygon. The outer contours of two adjacent pixel repeating units 10 have two adjacent edges. Two adjacent edges of the outer contours of two adjacent pixel repeating units 10 are parallel. In the present application, two adjacent edges of the outer contours of two adjacent pixel repeating units are parallel. This can reduce the gap between the adjacent repeating units of the pixel, thereby helping to increase the aperture ratio of the pixel.

In some embodiments, the first side of the first sub-pixel 11 and the first side of the second sub-pixel 12 are arranged in parallel. The second side of the first sub-pixel 11 is arranged parallel to the first side of the third sub-pixel 13. The second side of the second sub-pixel 12 is arranged in parallel with the second side of the third sub-pixel 13.

That is, adjacent edges of every two sub-pixels in the first sub-pixel 11, the second sub-pixel 12, and the third sub-pixel 13 are arranged in parallel. This is beneficial to improve a uniform light emission effect of the sub-pixels in the same pixel repeating unit 10.

In addition, in some embodiments, the first side of the first sub-pixel 11, the first side of the second sub-pixel 12, the second side of the first sub-pixel 11, the second side of the first sub-pixel 11, the first side of the third sub-pixel 13, the second side of the second sub-pixel 12 and the second side of the third sub-pixel 13 are all straight lines. The remaining edges of the first sub-pixel 11, the second sub-pixel 12, and the third sub-pixel 13 may be straight lines or may be concave arcs or convex arcs.

Further, in some embodiments, the shape of the first sub-pixel 11 includes a shape composed of straight lines. The shape of the second sub-pixel 12 includes a shape composed of straight lines. The shape of the third sub-pixel 13 includes a shape composed of straight lines. That is, all the edges of the first sub-pixel 11, the second sub-pixel 12, and the third sub-pixel 13 are arranged in straight lines.

Specifically, in some embodiments, the outer contour of the pixel repeating unit 10 is a quadrilateral. The shapes of the first sub-pixel 11, the second sub-pixel 12, and the third sub-pixel 13 are all quadrilateral. Further, the shapes of the second sub-pixel 12 and the third sub-pixel 13 are both trapezoids. The oblique waist of the trapezoid of the second sub-pixel 12 is arranged in parallel with the oblique waist of the trapezoid of the third sub-pixel 13. The oblique waist side 122 of the trapezoid of the second sub-pixel 12 is arranged in parallel with the oblique waist side 132 of the trapezoid of the third sub-pixel 13. This makes the center-to-center distance of every two sub-pixels in the first sub-pixel 11, the second sub-pixel 12, and the third sub-pixel 13 smaller, and there are no elongated pixels, which is beneficial to improve the display performance of the sub-pixels.

Further, within the same pixel repeating unit 10, the shape of the first sub-pixel 11 is a square, and the shapes of the second sub-pixel 12 and the third sub-pixel 13 are right-angled trapezoids. The first side 111 of the square of the first sub-pixel 11 is arranged in parallel with the first bottom side 121 of the right-angled trapezoid of the second sub-pixel 12. The second side 112 of the square of the first sub-pixel 11 is arranged in parallel with the first bottom side 131 of the right-angled trapezoid of the third sub-pixel 13. The first side 111 of the square of the first sub-pixel 11 is adjacent to the second side 112 of the square of the first sub-pixel 11.

The distance between the first side 111 of the square of the first sub-pixel 11 and the first bottom side 121 of the right-angled trapezoid of the second sub-pixel 12, the distance between the second side 112 of the square of the first sub-pixel 11 and the first bottom side 131 of the right-angled trapezoid of the third sub-pixel 13, and the distance between the oblique waist side 122 of the right angle trapezoid of the second sub-pixel 12 and the oblique waist side 132 of the right angle trapezoid of the third sub-pixel 13 are equal. The first sub-pixel 11, the second sub-pixel 12, and the third sub-pixel 13 are arranged at equal intervals between every two sub-pixels, which is beneficial to adjust the light-emitting effect of each of the pixel repeating units 10, so that the light-emitting color is more uniform.

Further, in the same pixel repeating unit 10, the third side 113 of the square of the first sub-pixel 11 and the straight waist side 134 of the right-angled trapezoid of the third sub-pixel 13 are located on the first side of the quadrilateral of the pixel repeating unit 10. The fourth side 114 of the square of the first sub-pixel 11 and the straight waist side 124 of the right-angled trapezoid of the second sub-pixel 12 are located on the second side of the quadrilateral of the pixel repeating unit 10. The second base 123 of the right-angled trapezoid of the second sub-pixel 12 is located on the third side of the quadrilateral of the pixel repeating unit 10. The second base 133 of the right-angled trapezoid of the third sub-pixel 13 is located on the fourth side of the quadrilateral of the pixel repeating unit 10.

Correspondingly, an embodiment of the present application further provides a display panel, which includes the pixel arrangement structure 100 described above.

The problem-solving principle of the display panel is similar to that of the aforementioned pixel arrangement structure 100. Therefore, the implementation and beneficial effects of the display panel can be referred to the description of the aforementioned pixel arrangement structure 100, and repeated details are not repeated here.

Figure 3:
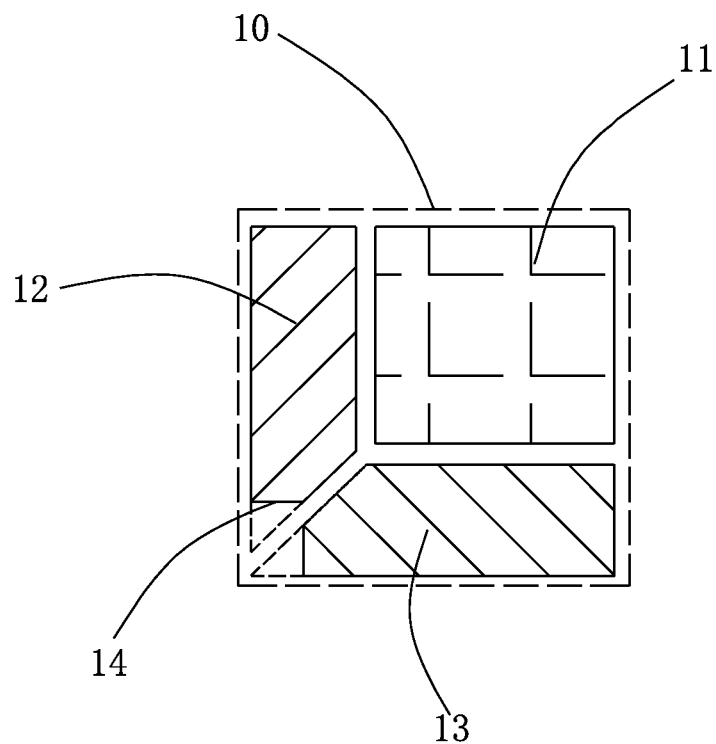
FIG. 3 is a second structural schematic diagram of a pixel arrangement structure provided by the present application.

Refer to FIG. 3, FIG. 3 is a second structural schematic diagram of the pixel arrangement structure 100 provided by the present application. This embodiment is different from the pixel arrangement structure 100 in FIG. 1. The right-angled trapezoid of the second sub-pixel 12 is provided with a fracture 14 between the angle between the oblique waist and the long base, and the right-angled trapezoid of the third sub-pixel 13 is provided with a fracture 14 between the angle between the oblique waist and the long base. In this way, the areas of the second sub-pixel 12 and the third sub-pixel 13 can be adjusted.

Figure 4:
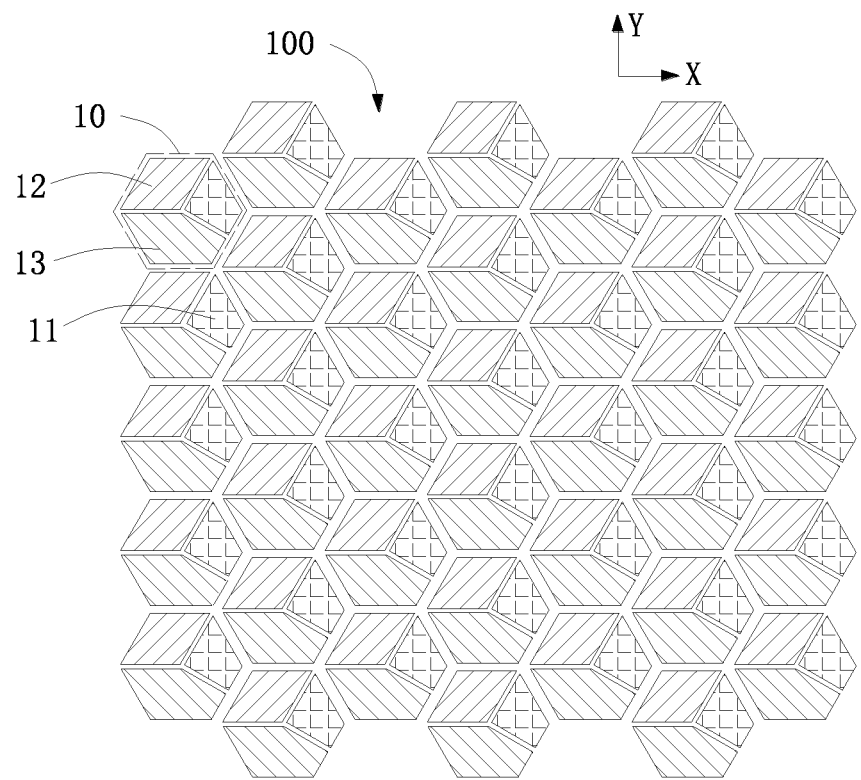
FIG. 4 is a third structural schematic diagram of a pixel arrangement structure provided by the present application.
Figure 5:
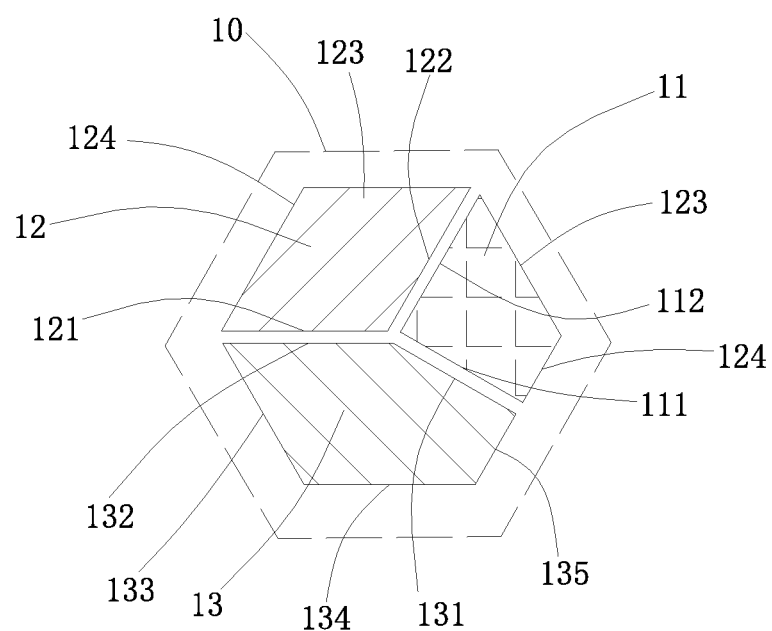
FIG. 5 is a schematic diagram of a pixel repeating unit in FIG. 4.

Refer to FIG. 4 and FIG. 5, FIG. 4 is a third structural schematic diagram of the pixel arrangement structure 100 provided by the present application. FIG. 5 is a schematic diagram of the pixel repeating unit 10 in FIG. 4. This embodiment is different from the pixel arrangement structure 100 in FIG. 1. The shape of the pixel repeating unit 10 is a hexagon, the shapes of the first sub-pixel 11 and the second sub-pixel 12 are both quadrilaterals, and the shape of the third sub-pixel 13 is a pentagon. Specifically, the shape of the pixel repeating unit 10 is a regular hexagon.

Further, in the same pixel repeating unit 10, the first side 131 of the pentagon of the third sub-pixel 13 is arranged in parallel with the first side 111 of the quadrangle of the first sub-pixel 11, the second side 132 of the pentagon of the third sub-pixel 13 is arranged in parallel with the first side 121 of the quadrangle of the second sub-pixel 12, the second side 112 of the quadrilateral of the first sub-pixel 11 is arranged in parallel with the second side 122 of the quadrilateral of the second sub-pixel 12, the first side 131 of the pentagon of the third sub-pixel 13 is adjacent to the second side 132 of the pentagon of the third sub-pixel 13, the first side 111 of the quadrilateral of the first sub-pixel 11 is adjacent to the second side 112 of the quadrilateral of the first sub-pixel 11, and the first side 121 of the quadrilateral of the second sub-pixel 12 is adjacent to the second side 122 of the quadrilateral of the second sub-pixel 12.

The distance between the first side 131 of the pentagon of the third sub-pixel 13 and the first side 111 of the quadrangle of the first sub-pixel 11, the distance between the second side 132 of the pentagon of the third sub-pixel 13 and the first side 121 of the quadrangle of the second sub-pixel 12, and the distance between the second side 112 of the quadrilateral of the first sub-pixel 11 and the second side 122 of the quadrilateral of the second sub-pixel 12 are equal.

The third side 133 of the pentagon of the third sub-pixel 13 is located on the first side of the hexagon of the pixel repeating unit 10. The fourth side 134 of the pentagon of the third sub-pixel 13 is located on the second side of the hexagon of the pixel repeating unit 10. The fifth side 135 of the pentagon of the third sub-pixel 13 and the fourth side 114 of the quadrangle of the first sub-pixel 11 are located on the third side of the hexagon of the pixel repeating unit 10. The third side 113 of the quadrangle of the first sub-pixel 11 is located on the fourth side of the hexagon of the pixel repeating unit 10. The third side 123 of the quadrangle of the second sub-pixel 12 is located on the fifth side of the hexagon of the pixel repeating unit 10. The fourth side 124 of the quadrangle of the second sub-pixel 12 is located on the sixth side of the hexagon of the pixel repeating unit 10.

In this embodiment, each pixel repeating unit 10 includes sub-pixels of three different colors. The first sub-pixel 11, the second sub-pixel 12, and the third sub-pixel 13 are respectively one of a red sub-pixel, a blue sub-pixel, and a green sub-pixel. Specifically, in this embodiment, the first sub-pixel 11 is a green sub-pixel, the second sub-pixel 12 is a red sub-pixel, and the third sub-pixel 13 is a blue sub-pixel. Further, the area of the third sub-pixel 13 is greater than that of the second sub-pixel 12, and the area of the second sub-pixel 12 is greater than that of the first sub-pixel 11.

Figure 6:
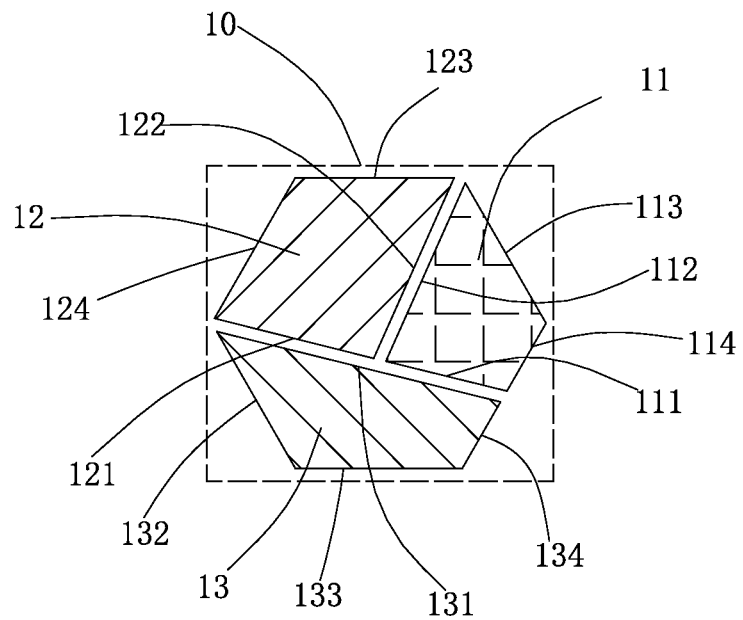
FIG. 6 is a fourth structural schematic diagram of a pixel arrangement structure provided by the present application.

Refer to FIG. 6, FIG. 6 is a fourth structural schematic diagram of the pixel arrangement structure 100 provided by the present application. This embodiment is different from the pixel arrangement structure 100 in FIG. 1. The shape of the pixel repeating unit 10 is a hexagon, and the shapes of the first sub-pixel 11, the second sub-pixel 12, and the third sub-pixel 13 are all quadrilateral. Specifically, the shape of the pixel repeating unit 10 is a regular hexagon.

Further, in the same pixel repeating unit 10, the first side 131 of the quadrilateral of the third sub-pixel 13 is arranged in parallel with the first side 111 of the quadrilateral of the first sub-pixel 11, the first side 131 of the quadrilateral of the third sub-pixel 13 is arranged in parallel with the first side 121 of the quadrilateral of the second sub-pixel 12, the second side 112 of the quadrilateral of the first sub-pixel 11 is arranged in parallel with the second side 122 of the quadrilateral of the second sub-pixel 12, the first side 111 of the quadrilateral of the first sub-pixel 11 is adjacent to the second side 112 of the quadrilateral of the first sub-pixel 11, and the first side 121 of the quadrilateral of the second sub-pixel 12 is adjacent to the second side 122 of the quadrilateral of the second sub-pixel 12.

The distance between the first side 131 of the quadrilateral of the third sub-pixel 13 and the first side 111 of the quadrilateral of the first sub-pixel 11, the distance between the first side 131 of the quadrilateral of the third sub-pixel 13 and the first side 121 of the quadrilateral of the second sub-pixel 12, and the distance between the second side 112 of the quadrilateral of the first sub-pixel 11 and the second side 122 of the quadrilateral of the second sub-pixel 12 are equal.

The second side 132 of the quadrangle of the third sub-pixel 13 is located on the first side of the hexagon of the pixel repeating unit 10. The third side 133 of the quadrangle of the third sub-pixel 13 is located on the second side of the hexagon of the pixel repeating unit 10. The fourth side 134 of the quadrilateral of the third sub-pixel 13 and the fourth side 114 of the quadrilateral of the first sub-pixel 11 are located on the third side of the hexagon of the pixel repeating unit 10. The third side 113 of the quadrangle of the first sub-pixel 11 is located on the fourth side of the hexagon of the pixel repeating unit 10. The third side 123 of the quadrangle of the second sub-pixel 12 is located on the fifth side of the hexagon of the pixel repeating unit 10. The fourth side 124 of the quadrangle of the second sub-pixel 12 is located on the sixth side of the hexagon of the pixel repeating unit 10.

Figure 7:
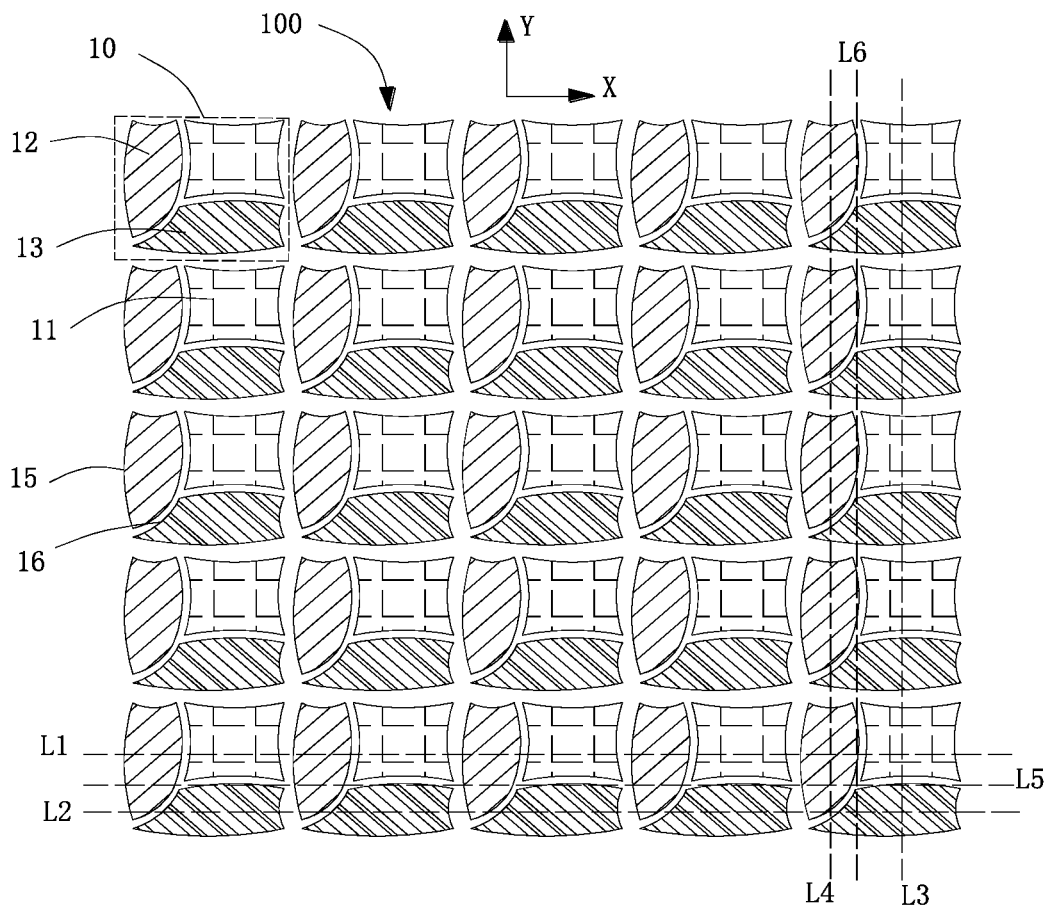
FIG. 7 is a fifth structural schematic diagram of a pixel arrangement structure provided by the present application.
Figure 8:
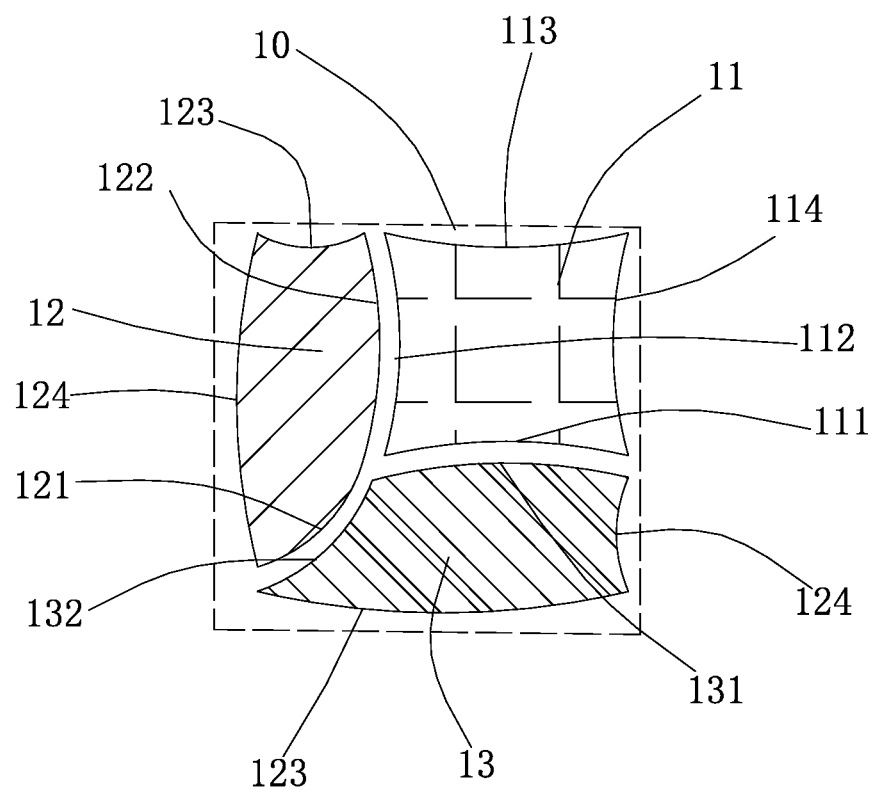
FIG. 8 is a schematic diagram of a pixel repeating unit in FIG. 7.

Refer to FIG. 7 and FIG. 8, FIG. 7 is a fifth structural schematic diagram of the pixel arrangement structure 100 provided by the present application, and FIG. 8 is a schematic diagram of the pixel repeating unit 10 in FIG. 7. This embodiment is different from the pixel arrangement structure 100 in FIG. 1. The first side 111 of the first sub-pixel 11 is one of an outer convex arc 15 and an inner concave arc 16, and the first side 131 of the third sub-pixel 13 is the other of the outer convex arc 15 and the inner concave arc 16. The second side 112 of the first sub-pixel 11 is one of an outer convex arc 15 and an inner concave arc 16, and the second side 122 of the second sub-pixel 12 is the other of the outer convex arc 15 and the inner concave arc 16. The first side 121 of the second sub-pixel 12 is one of the outer convex arc 15 and the inner concave arc 16, and the second side 132 of the third sub-pixel 13 is the other of the outer convex arc 15 and the inner concave arc 16.

That is, in the present application, between the first side 111 of the first sub-pixel 11 and the first side 131 of the third sub-pixel 13, between the second side 112 of the first sub-pixel 11 and the second side 123 of the second sub-pixel 12, between the first side 121 of the second sub-pixel 12 and the second side 132 of the third sub-pixel 13 are respectively provided with complementary convex arc 15 and concave arc 16. Therefore, the area ratio of different sub-pixels can be adjusted, and further, the center spacing of adjacent sub-pixels can be kept unchanged, so that the pixel repeating unit 10 can have better light-emitting effect and saturation.

Specifically, the first side 111 of the first sub-pixel 11 is an inner concave arc 16, and the first side 131 of the third sub-pixel 13 is an outer convex arc 15. The second side 112 of the first sub-pixel 11 is a concave arc 16, and the second side 122 of the second sub-pixel 12 is an outer convex arc 15. The first side 121 of the second sub-pixel 12 is an outer convex arc 15, and the second side 132 of the third sub-pixel 13 is an inner concave arc 16. The remaining edges of the first sub-pixel 11 may be any one of straight lines, concave arcs 16, and convex arcs 15. The remaining edges of the second sub-pixel 12 may be any one of straight lines, concave arcs 16, and convex arcs 15. The remaining edges of the third sub-pixel 13 may be any one of straight lines, concave arcs 16, and convex arcs 15.

In some embodiments, the shape of the first sub-pixel 11 includes a shape formed by an outer convex arc 15 and/or an inner concave arc 16. The shape of the second sub-pixel 12 includes a convex arc 15 and/or a concave arc 16. The shape of the third sub-pixel 13 includes a convex arc 15 and/or a concave arc 16. The first side 111 of the first sub-pixel 11 and the first side 131 of the third sub-pixel 13 are complementary in shape. The second side 112 of the first sub-pixel 11 and the second side 121 of the second sub-pixel 12 are complementary in shape. The first side 121 of the second sub-pixel 12 and the second side 132 of the third sub-pixel 13 are complementary in shape.

Specifically, the shape of the pixel repeating unit 10 is a quadrilateral. The shapes of the first sub-pixel 11, the second sub-pixel 12, and the third sub-pixel 13 are quadrilateral. The shape of the first sub-pixel 11 is a quadrilateral including a concave arc 16. The first side 121 of the second sub-pixel 12 is the convex arc 15. The second side 122 of the second sub-pixel 12 is the convex arc 15. The third side 123 of the second sub-pixel 12 is a concave arc 16. The fourth side 124 of the second sub-pixel 12 is the convex arc 15. The first side 131 of the third sub-pixel 13 is the convex arc 15. The second side 132 of the third sub-pixel 13 is a concave arc 16. The third side 133 of the third sub-pixel 13 is the convex arc 15. The fourth side 134 of the third sub-pixel 13 is a concave arc 16. The third side 133 of the third sub-pixel 13 is located on the first side of the quadrangle of the pixel repeating unit 10. The fourth side 124 of the second sub-pixel 12 is located on the second side of the quadrilateral of the pixel repeating unit 10. The third side 123 of the second sub-pixel 12 and the third side 113 of the first sub-pixel 11 are located on the third side of the quadrangle of the pixel repeating unit 10. The fourth side 134 of the third sub-pixel 13 and the fourth side 114 of the first sub-pixel 11 are located on the fourth side of the quadrilateral of the pixel repeating unit 10.

The pixel arrangement structure and the display panel provided by the embodiments of the present application are described in detail above. Specific examples are used herein to illustrate the principles and implementations of the present application. The descriptions of the above embodiments are only used to help understand the method and the core idea of the present application. In addition, for those skilled in the art, according to the idea of the present application, there will be changes in the specific embodiments and application scope. In conclusion, the content of this specification should not be construed as a limitation on the present application.

What is claimed is:

1. A pixel arrangement structure, comprising:
a plurality of pixel repeating units arranged in an array;
wherein one of the plurality of pixel repeating units comprises:
a first sub-pixel;
a second sub-pixel;

a third sub-pixel;
a first virtual straight line disposed along a first direction, the first virtual straight line passing through the first sub-pixel and the second sub-pixel;
a second virtual straight line disposed along the first direction, the second virtual straight line passing through the second sub-pixel and the third sub-pixel;
a third virtual straight line disposed along a second direction, the third virtual straight line passing through the first sub-pixel and the third sub-pixel; and
a fourth virtual straight line disposed along the second direction, the fourth virtual straight line passing through the second sub-pixel and the third sub-pixel;
wherein the first direction is perpendicular to the second direction;
wherein an outer contour of the one of the plurality of pixel repeating units is a hexagon, shapes of the first sub-pixel and the second sub-pixel are quadrilateral, and a shape of the third sub-pixel is a pentagon;
wherein in a same one of the plurality of pixel repeating units, a first side of the pentagon of the third sub-pixel is arranged in parallel with a first side of the quadrilateral of the first sub-pixel, a second side of the pentagon of the third sub-pixel is arranged in parallel with a first side of the quadrilateral of the second sub-pixel, a second side of the quadrilateral of the first sub-pixel is arranged in parallel with a second side of the quadrilateral of the second sub-pixel, the first side of the pentagon of the third sub-pixel is adjacent to the second side of the pentagon of the third sub-pixel, the first side of the quadrilateral of the first sub-pixel is adjacent to the second side of the quadrilateral of the first sub-pixel, and the first side of the quadrilateral of the second sub-pixel is adjacent to the second side of the quadrilateral of the second sub-pixel.

2. The pixel arrangement structure of claim 1, wherein the one of the plurality of pixel repeating units further comprises:
a fifth virtual straight line disposed along the first direction, the fifth virtual straight line passing through the second sub-pixel but not passing through the first sub-pixel.

3. The pixel arrangement structure of claim 1, wherein the one of the plurality of pixel repeating units further comprises:
a sixth virtual straight line disposed along the second direction, the sixth virtual straight line passing through the third sub-pixel but not passing through the first sub-pixel.

4. The pixel arrangement structure of claim 1, wherein an area of the first sub-pixel is greater than an area of the second sub-pixel, and the area of the second sub-pixel is greater than an area of the third sub-pixel.

5. The pixel arrangement structure of claim 1, wherein in a row direction, a center connecting line of the first sub-pixel and a center connecting line of the second sub-pixel are not coaxial.

6. The pixel arrangement structure of claim 1, wherein in a row direction, a center connecting line of the first sub-pixel and a center connecting line of the third sub-pixel are not coaxial.

7. The pixel arrangement structure of claim 1, wherein in a column direction, a center connecting line of the first sub-pixel and a center connecting line of the third sub-pixel are not coaxial.

8. The pixel arrangement structure of claim 1, wherein in a column direction, a center connecting line of the second sub-pixel and a center connecting line of the third sub-pixel are not coaxial.

9. The pixel arrangement structure of claim 1, wherein a third side of the pentagon of the third sub-pixel is located on a first side of the hexagon of the one of the plurality of pixel repeating units, a fourth side of the pentagon of the third sub-pixel is located on a second side of the hexagon of the one of the plurality of pixel repeating units, a fifth side of the pentagon of the third sub-pixel and a fourth side of the quadrilateral of the first sub-pixel are located on a third side of the hexagon of the one of the plurality of pixel repeating units, a third side of the quadrilateral of the first sub-pixel is located on a fourth side of the hexagon of the one of the plurality of pixel repeating units, a third side of the quadrilateral of the second sub-pixel is located on a fifth side of the hexagon of the one of the plurality of pixel repeating units, and a fourth side of the quadrilateral of the second sub-pixel is located on a sixth side of the hexagon of the one of the plurality of pixel repeating units.

10. A display panel, comprising:
a pixel arrangement structure comprising:
a plurality of pixel repeating units arranged in an array;
wherein one of the plurality of pixel repeating units comprises:
a first sub-pixel;
a second sub-pixel;
a third sub-pixel;
a first virtual straight line disposed along a first direction, the first virtual straight line passing through the first sub-pixel and the second sub-pixel;
a second virtual straight line disposed along the first direction, the second virtual straight line passing through the second sub-pixel and the third sub-pixel;
a third virtual straight line disposed along a second direction, the third virtual straight line passing through the first sub-pixel and the third sub-pixel; and
a fourth virtual straight line disposed along the second direction, the fourth virtual straight line passing through the second sub-pixel and the third sub-pixel;
wherein the first direction is perpendicular to the second direction;
wherein an outer contour of the one of the plurality of pixel repeating units is a hexagon, shapes of the first sub-pixel and the second sub-pixel are quadrilateral, and a shape of the third sub-pixel is a pentagon;
wherein in a same one of the plurality of pixel repeating units, a first side of the pentagon of the third sub-pixel is arranged in parallel with a first side of the quadrilateral of the first sub-pixel, a second side of the pentagon of the third sub-pixel is arranged in parallel with a first side of the quadrilateral of the second sub-pixel, a second side of the quadrilateral of the first sub-pixel is arranged in parallel with a second side of the quadrilateral of the second sub-pixel, the first side of the pentagon of the third sub-pixel is adjacent to the second side of the pentagon of the third sub-pixel, the first side of the quadrilateral of the first sub-pixel is adjacent to the second side of the quadrilateral of the first sub-pixel, and the first side of the quadrilateral of the second sub-pixel is adjacent to the second side of the quadrilateral of the second sub-pixel.

11. The display panel of claim 10, wherein the one of the plurality of pixel repeating units further comprises:

a fifth virtual straight line disposed along the first direction, the fifth virtual straight line passing through the second sub-pixel but not passing through the first sub-pixel.

12. The display panel of claim 10, wherein the one of the plurality of pixel repeating units further comprises:
a sixth virtual straight line disposed along the second direction, the sixth virtual straight line passing through the third sub-pixel but not passing through the first sub-pixel.

13. The display panel of claim 10, wherein an area of the first sub-pixel is greater than an area of the second sub-pixel, and the area of the second sub-pixel is greater than an area of the third sub-pixel.

14. The display panel of claim 10, wherein in a row direction, a center connecting line of the first sub-pixel and a center connecting line of the second sub-pixel are not coaxial.

15. The display panel of claim 10, wherein in a row direction, a center connecting line of the first sub-pixel and a center connecting line of the third sub-pixel are not coaxial.

16. The display panel of claim 10, wherein in a column direction, a center connecting line of the first sub-pixel and a center connecting line of the third sub-pixel are not coaxial.

17. The display panel of claim 10, wherein in a column direction, a center connecting line of the second sub-pixel and a center connecting line of the third sub-pixel are not coaxial.

18. The display panel of claim 10, wherein an outer contour of the one of the plurality of pixel repeating units is a polygon, outer contours of two adjacent pixel repeating units have two adjacent edges, and the two adjacent edges of the outer contours of the two adjacent pixel repeating units are parallel.

* * * * *